(12) United States Patent
Kitakado

(10) Patent No.: US 8,174,053 B2
(45) Date of Patent: May 8, 2012

(54) SEMICONDUCTOR DEVICE, PRODUCTION METHOD THEREOF, AND ELECTRONIC DEVICE

(75) Inventor: Hidehito Kitakado, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 13 days.

(21) Appl. No.: 12/438,394

(22) PCT Filed: Jun. 4, 2007

(86) PCT No.: PCT/JP2007/061313
§ 371 (c)(1),
(2), (4) Date: Feb. 23, 2009

(87) PCT Pub. No.: WO2008/029544
PCT Pub. Date: Mar. 13, 2008

(65) Prior Publication Data
US 2010/0001273 A1   Jan. 7, 2010

(30) Foreign Application Priority Data
Sep. 8, 2006   (JP) .................................. 2006-244516

(51) Int. Cl.
*H01L 29/10* (2006.01)
(52) U.S. Cl. .................... 257/213; 257/66; 257/E21.411
(58) Field of Classification Search .................... 257/57, 257/347, 66, E21.411, E29.273, E51.005, 257/E27.1
See application file for complete search history.

(56) References Cited

U.S. PATENT DOCUMENTS

| | | | |
|---|---|---|---|
| 5,970,338 A | 10/1999 | Tempel | |
| 6,111,304 A | 8/2000 | Sonoda | |
| 6,936,844 B1* | 8/2005 | Yamazaki et al. | ............ 257/59 |
| 2003/0160285 A1 | 8/2003 | Shiiki | |
| 2004/0004593 A1* | 1/2004 | Okumura et al. | ............ 345/87 |
| 2004/0135146 A1* | 7/2004 | Yamazaki et al. | ............ 257/59 |
| 2005/0258341 A1* | 11/2005 | Nishikawa et al. | ........ 250/214.1 |

(Continued)

FOREIGN PATENT DOCUMENTS

CN   1195425 A   10/1998

(Continued)

OTHER PUBLICATIONS

International Search Report for PCT/JP2007/061313, mailed Aug. 21, 2007.

(Continued)

*Primary Examiner* — Evan Pert
*Assistant Examiner* — Selim Ahmed
(74) *Attorney, Agent, or Firm* — Nixon & Vanderhye P.C.

(57) ABSTRACT

The present invention provides a semiconductor device which includes a thin film transistor as a resistance element, wherein a variation in resistance of the thin film transistor is suppressed without increasing an area of the resistance element and the resistance element can be produced through simplified production steps. The semiconductor device of the present invention is a semiconductor device including a first thin film transistor and a second thin film transistor on a substrate, the first thin film transistor being used as a resistance element, the second thin film transistor including a semiconductor layer having a low concentration drain region and a high concentration drain region, the low concentration drain region and the high concentration drain region being different in impurity concentration, wherein an impurity concentration of a channel region of a semiconductor layer in the first thin film transistor is the same as an impurity concentration of the low concentration drain region of the semiconductor layer in the second thin film transistor.

10 Claims, 6 Drawing Sheets

U.S. PATENT DOCUMENTS

2005/0285111 A1 * 12/2005 Tsuboi .......................... 257/66

FOREIGN PATENT DOCUMENTS

| CN | 1433075 A | 7/2003 |
| JP | 4-241452 | 8/1992 |
| JP | 5-152571 | 6/1993 |
| JP | 10-74894 | 3/1998 |
| JP | 2000-31295 | 1/2000 |
| JP | 2003-273233 | 9/2003 |
| WO | 2006/072899 A1 | 7/2006 |
| WO | WO 2006072899 A1 * | 7/2006 |

OTHER PUBLICATIONS

CN Office Action mailed Feb. 3, 2010 in corresponding Chinese application 2007800270418.

* cited by examiner (a)

Fig.6-b
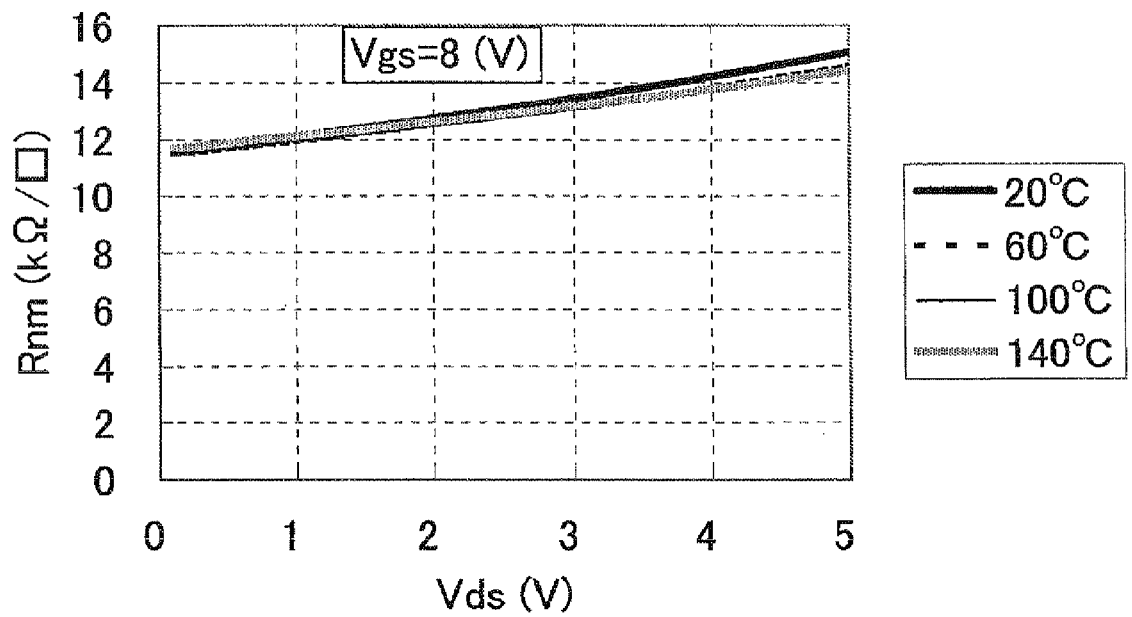
Fig.6-c
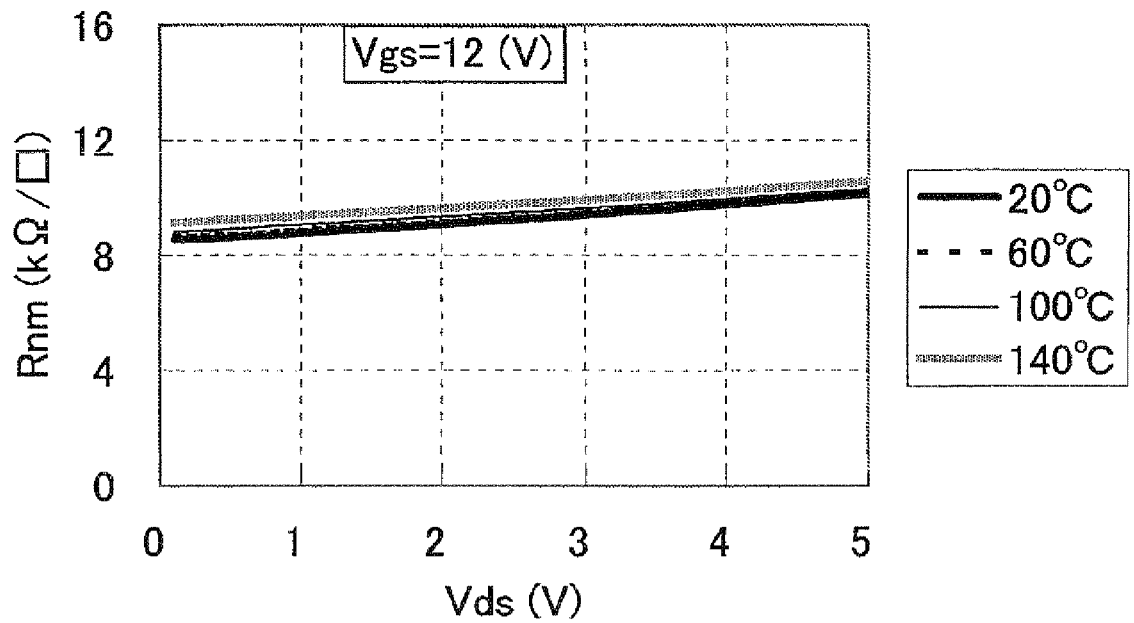

Fig.7-a
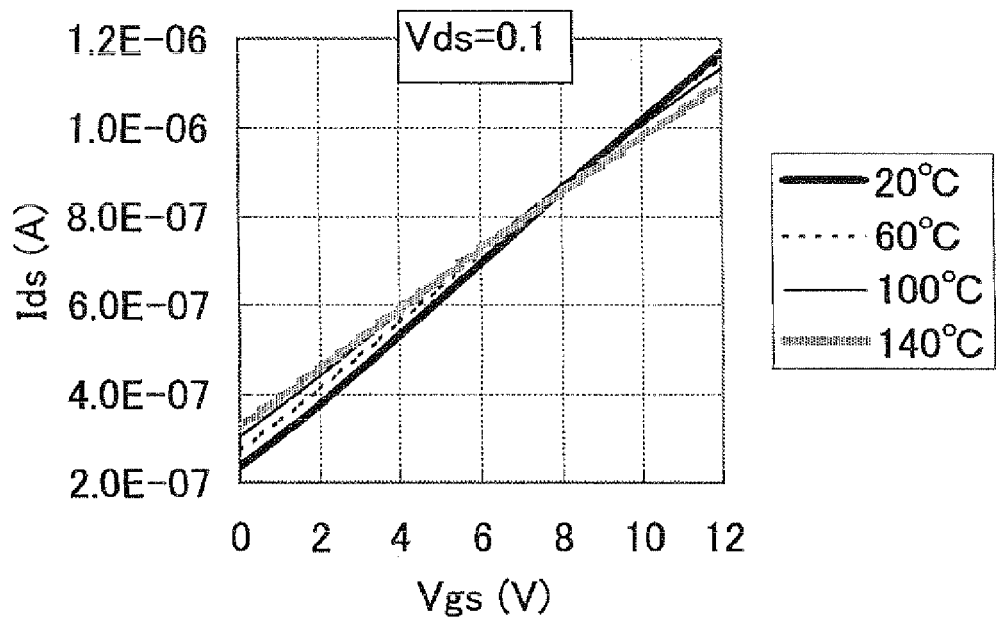
Fig.7-b
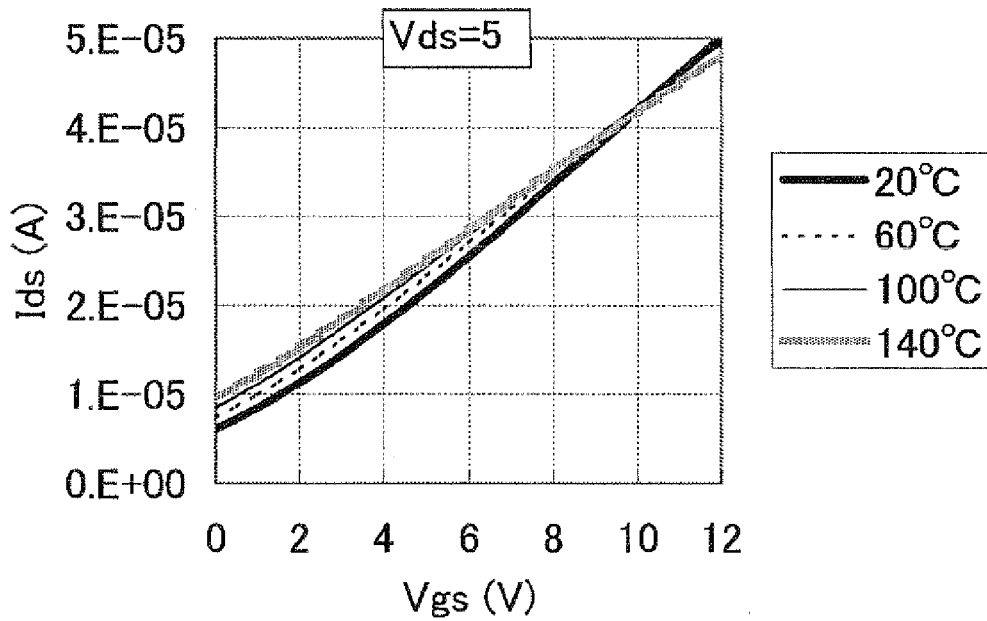

US 8,174,053 B2

SEMICONDUCTOR DEVICE, PRODUCTION METHOD THEREOF, AND ELECTRONIC DEVICE

This application is the U.S. national phase of International Application No. PCT/JP2007/061313, filed 4 Jun. 2007, which designated the U.S. and claims priority to Japan Application No. 2006-244516, filed 8 Sept. 2006, the entire contents of each of which are hereby incorporated by reference.

TECHNICAL FIELD

The present invention relates to a semiconductor device, a production method thereof, and an electronic device. More specifically, the present invention relates to a semiconductor device including a thin film transistor (TFT) used as a resistance element and a TFT having an LDD (Lightly Doped Drain) structure such as a GOLD (Gate Overlapped Lightly Doped Drain) structure used as a switching element. The present invention also relates to a production method of such a semiconductor device and an electronic device.

BACKGROUND ART

An electronic device such as a liquid crystal display device includes a semiconductor device which includes a TFT for controlling driving of a pixel. For example, according to a liquid crystal display device, a driver including a TFT, a switching element, and the like, is formed on an active matrix substrate. It is commonly known that the TFT which is used as a driver or a switching element in an electronic device brings the following advantages to the electronic device: low power consumption, high performances, high-speed operation, and downsizing. Using a resistance of a diffusion layer of the TFT, the TFT can be used as a three terminal type-variable resistance element composed of gate, source, and drain. The resistance of such a resistance element can be normally adjusted by a bias voltage (Vgs) which is applied to the gate. In this case, the TFT is incorporated in an integrated circuit to be arranged at various positions of the electronic device in order to exhibit the following effects: determining a gain in a feedback amplifying circuit; dividing a voltage; applying bias to the element; and determining a value of time constant (RC) of an active filter (for example, refer to Patent Document 1).

However, the TFT in Patent Document 1 has a double-gate structure in order to secure a high resistance, and the number of production steps is larger than the number of production steps needed for forming a normal TFT having a single gate. Also in the obtained TFT, the resistance largely varies depending on the variation in thickness of the gate insulating film. Further, in the resistance element that is a silicon which is just doped with impurities, the resistance value largely varies depending on variation in concentration of the impurities. As a result, a voltage or a current the circuit needs is inaccurately determined.

Under the above-mentioned circumstances, the following electronic device is disclosed (for example, refer to Patent Document 2). The electronic device includes a circuit operation FET having a salicide structure on its surface and a resistance element FET having no salicide structure on its surface, in which the FETs are arranged on the same semiconductor substrate, and thereby the length of the resistance of the resistance element can be suppressed. Further, the following semiconductor device which has a bleeder resistance circuit is disclosed (for example, refer to Patent Document 3). According to this semiconductor device, the thickness of a polysilicon resistor is decreased and then P-type impurities are injected into the polysilicon thin film resistor, and thereby a variation in resistance and temperature dependency of resistance can be suppressed. However, in the Patent Document 2, the FET is limited to one having a salicide structure. In the Patent Document 3, the semiconductor device is limited to one including a bleeder resistance circuit. Therefore, in both of the Patent Documents 2 and 3, the applications are limited. In each of Patent Documents 2 and 3, the structure, the production steps, and the like, are largely different between the TFT that is used as a resistance element and the TFT that performs driving control. Then, the number of steps of the production process is increased. Therefore, there is still room for improvement.

[Patent Document 1]
 Japanese Kokai. Publication No. Hei-05-152571
[Patent Document 2]
 Japanese Kokai Publication No. 2000-31295
[Patent Document 3]
 Japanese Kokai Publication No. 2003-273233

DISCLOSURE OF INVENTION

The present invention has been made in view of the above-mentioned state of the art. The present invention has an object to provide a semiconductor device which includes a thin film transistor as a resistance element, where in a variation in resistance among the thin film transistors is suppressed without increasing an area of the resistance element and the resistance element can be produced through simplified production steps.

The present inventor made various investigations on a semiconductor device which can suppress a variation in resistance of TFTs that are used as a resistance element. The inventor noted a structure of a channel region in the TFT. Then, the inventor found the followings. In the case that polycrystalline silicon is doped with impurities to provide resistance elements by a common method, a variation in resistance can be suppressed to about 10 to 20% if the resistance elements are those having a resistance of about 1 k$\Omega$/□. However, if the resistance elements need to have a high resistance, an area of the resistance element needs to be increased. In contrast, if resistance elements having a high resistance of 10 to 100 k$\Omega$/□ are formed, the area of the resistance element can be decreased, but the variation in resistance is as large as about 50%. The inventor found that even if the area of the resistance element is not increased, high resistance elements having a resistance of about 10 k$\Omega$/□ can be formed within about 10% of a variation in resistance in the case that a driving control TFT having an LDD structure (COLD structure) and a resistance element TFT are formed on the same substrate; and a channel region in the resistance element TFT has the same impurity concentration as that in a low concentration drain region of the driving control LDD-type TFT (COLD-type TFT) Further, the impurity concentration of these TFTs can be determined in the same step. Therefore, the production steps can be simplified. As a result, the above-mentioned problems can be admirably solved, leading to completion of the present invention.

That is, the present invention is related to at least a semiconductor device including a semiconductor layer having a first thin film transistor and a second thin film transistor on a substrate, the first thin film transistor being used as a resistance element, the second thin film transistor including a low concentration drain region and a high concentration drain region, the low concentration drain region and the high concentration drain region being different in impurity concentration, wherein an impurity concentration of a channel region of a semiconductor layer in the first thin film transistor is the same as an impurity concentration of the low concentration drain region of the semiconductor layer in the second thin film transistor.

An aspect of the present invention is mentioned below in more detail.

An example semiconductor device of the present invention includes, on a substrate, the first TFT used as a resistance element and the second TFT including a semiconductor layer having a low concentration drain region and a high concentration drain region. The low concentration drain region and the high concentration drain region are different in impurity concentration. The first TFT includes, on the substrate, three terminals of a source electrode, a drain electrode, and a gate electrode, and further includes a semiconductor layer. The semiconductor layer includes a channel region facing the gate electrode, a source region connected to the source electrode, and a drain region connected to the drain electrode. The channel region of the semiconductor layer is positioned between the source region and the drain region, and it is generally a region having the lowest impurity concentration (the lowest doping amount of impurity ions) of the semiconductor layer.

The first TFT included in the semiconductor device example of the present invention controls a current which flows in the channel region positioned between the source region and the drain region by a voltage applied to the gate electrode. The first TFT can be used as a resistance element because the channel region of the first TFT has a resistance. That is, according to the first thin film transistor included in the semiconductor device of the present invention, it is preferable that a resistance in the channel region (between drain and source) of the semiconductor layer in the first thin film transistor varies depending on a voltage applied to a gate electrode. The second TFT is used as a switching element which performs driving control of the semiconductor device. The second TFT also includes, on the substrate, three terminals of a source electrode, a drain electrode, and a gate electrode, and further includes a semiconductor layer. The semiconductor layer of the second TFT also includes a channel region facing the gate electrode, a source region connected to the source electrode, and a drain region connected to the drain electrode. The second TFT has a so-called LDD structure (GOLD structure) in which the drain region includes a low concentration drain region and a high concentration drain region, the low concentration drain region and the high concentration drain region being different in impurity concentration. The second TFT is generally used as a switching element. However, the example semiconductor device of the present invention includes, as the switching element, a TFT having a single drain structure where no low concentration drain region is formed, as long as the TFT having an LDD structure (GOLD structure) is included. In the present description, the "low concentration" and the "high concentration" in the "low concentration drain region" and the "high concentration drain region" represent a level of the concentration of the impurity between these two regions. The value of the concentration of each region is not especially limited as long as the impurity concentration of the low concentration drain region is lower than the impurity concentration of the high concentration drain region. The "impurity" in the present specification means an ion (atom) which generates a carrier (positive hole or electron) contained in the semiconductor layer. As the impurity which is contained in the semiconductor layer, a phosphorus ion (atom) and the like may be mentioned if the TFT is an N-type one, and a boron ion (atom) and the like may be mentioned if the TFT is a P-type one. The semiconductor device of the present invention includes a TFT having an LDD structure or a TFT having a GOLD structure. Therefore, deterioration of the transistor (reduction in characteristics due to deterioration of a drain current) due to hot carrier deterioration generated when a power supply voltage is about 6V to 12V can be suppressed. Particularly, the N-type TFT is much deteriorated. Therefore, it is effective that a transistor having an LDD structure or a GOLD structure is used in a circuit which needs a voltage of 6V to 12V or more. The impurity concentration in the low concentration drain region varies depending on the species of the impurity. The resistance in the low concentration drain region is preferably 10 k$\Omega$/□ or more and 200 k$\Omega$/□ or less at 25° C., and more preferably 10 k$\Omega$/□ or more and 100 k$\Omega$/□ or less at 25° C. Within these ranges, the semiconductor device can obtain more optimal characteristics in view of both of the resistance element TFT and prevention of the hot carrier deterioration of the TFT having a GOLD structure.

In an aspect of the present invention, the channel region in the first TFT has the same impurity concentration as that of the low concentration drain region in the second TFT. According to such resistance elements, the variation in resistance can be easily suppressed. According to the example TFT embodiment of the present invention, the resistance element that is the first TFT and the low concentration drain region of the second TFT can be simultaneously formed, which leads to simplification of production steps of the semiconductor device. The lower limit of the preferable range of the impurity concentration in the low concentration drain region is 1E17 ion/cm$^3$. The upper limit thereof is 1E18 ion/cm$^3$. In the present description, 1Ex (x is any number) means 1×10$^x$. Further, the phrase "the same" means that the impurity concentrations are substantially the same as long as the operation and effects of the present invention can be exhibited. Specifically, a ratio of a difference between the impurity concentration of the channel region in the first TFT and the impurity concentration of the low concentration drain region in the second TFT relative to an average value of these impurity concentrations is preferably 10% or less, and more preferably 5% or less. If this impurity concentration is larger than 1E17 to 1E18 ion/cm$^3$, the sheet resistance is low, and an area of the resistance element is increased in order to obtain a desire resistance. In contrast, if the impurity concentration is lower than 1E17 to 1E18 ion/cm$^3$, the resistance more largely depends on a gate voltage. If the voltage applied to the gate varies, the resistance value also varies.

According to the TFT included in the semiconductor device of the present invention, temperature dependency of a drain current can be suppressed. Therefore, a circuit whose characteristics are not varied depending on a variation in temperature can be formed at the same power voltage.

It is preferable that the first thin film transistor is an N-type transistor used by applying a voltage of 6V to 12V to the gate electrode. The above-mentioned first TFT can control a current which flows in the channel region positioned between the source region and the drain region by a voltage applied to the gate electrode. If the channel region in the resistance element and the low concentration drain region having a so-called LDD structure or GOLD structure have the same impurity concentration, a voltage of 6V to 12V is applied to the gate electrode to control the current. As a result, a variation in resistance of the first TFTs, generated depending on a voltage (Vds) between drain and source or a temperature, can be sufficiently suppressed. If a voltage of less than 6V is applied to the gate electrode, the resistance largely varies in accordance with a variation in temperature in some cases. If a voltage is more than 12V, the resistance varies depending on the temperature, and further the resistance might be decreased. Therefore, the area of the resistance element needs to be increased. In the present description, the voltage between source and drain is defined as a positive voltage when an electric potential on the drain side is higher, and it is defined as a negative voltage when an electric potential on the source side is higher.

It is preferable that the first thin film transistor is a P-type transistor used by applying a voltage of −6V to −12V to the gate electrode. If the P-type transistor is used, a voltage opposite to a voltage applied to the above-mentioned N-type transistor is applied. As a result, generation of a variation in resistance of the first TFTs can be sufficiently suppressed.

The present invention is also related to a production method of a semiconductor device, the semiconductor device including a first thin film transistor and a second thin film transistor on a substrate, the first thin film transistor being used as a resistance element, the second thin film transistor including a drain region having a low concentration drain region and a high concentration drain region, the low concentration drain region and the high concentration drain region being different in impurity concentration, wherein impurities are simultaneously injected into a channel region of a semiconductor layer in the first thin film transistor and into the low concentration drain region of a semiconductor layer in the second thin film transistor. In the present invention, the first TFT channel region and the low concentration drain region of the second TFT can be formed of the same material and formed to have the same impurity concentration. In this case, the two regions can be prepared in the same step. As a result, the production steps of the semiconductor device can be simplified. In the present invention, the lower limit of the preferable range of the concentration of impurities injected in the low concentration drain region is 1E13 ion/cm$^2$. The upper limit thereof is 1E14 ion/cm$^2$.

The present invention is also related to an electronic device including the semiconductor device or a semiconductor device produced by the production method. According to the electronic device of the present invention, the variation in resistance among the resistance elements in the semiconductor device can be easily suppressed. Examples of the electronic device include display devices such as a liquid crystal display device and an organic electroluminescent display device. An electronic device including the semiconductor device of the present invention can stably operate without being influenced by a temperature where the electronic device is used.

EFFECT OF THE INVENTION

The semiconductor device of the present invention includes TFTs as a resistance element, and a variation in resistance among the TFTs can be easily suppressed without increasing an area of the TFTs. According to the semiconductor device of the present invention, the driving control TFT and the resistance element TFT can be prepared in the same step. Therefore, the production steps can be simplified.

BEST MODES FOR CARRYING OUT THE INVENTION

The present invention is mentioned in more detail below with reference to Examples, using drawings, but the present invention is not limited to these Embodiments.

Embodiment 1

The configuration of the semiconductor device in Embodiment 1 of the present invention is mentioned below with reference to FIGS. 1(a) and 1(b). FIG. 1(a) is a cross sectional view schematically showing the first TFT which is used as a resistance element (hereinafter, also referred to as a resistance element TFT) of the semiconductor device in Embodiment 1. FIG. 1(b) is a cross sectional view schematically showing the second TFT having a GOLD structure which is used as a driving control element (hereinafter, also referred to as a COLD structure TFT) of the semiconductor device in Embodiment 1. According to the semiconductor device in the present Embodiment, the resistance element TFT and the GOLD structure TFT are formed on the same substrate.

As shown in FIG. 1(a), according to the configuration of the resistance element TFT used in Embodiment 1, the first insulating film 2 composed of an impurity diffusion barrier film 2a and a stress relaxation layer 2b is formed on a substrate 1. A semiconductor layer 3 is formed on the first insulating film 2. The semiconductor layer 3 includes low resistance (high concentration impurity) regions 3a and 3b, and a channel (low concentration impurity) region 3c. The low resistance regions 3a and 3b function as source and drain, respectively. Further, the second insulating film 4 that is a gate insulating film is formed on the semiconductor layer 3. A gate electrode 5 is formed in a region overlapping with the channel region 3c on the second insulating film 4. The third insulating film 6 is formed in on the second insulating film 4 and the gate electrode 5. A source wiring 7a and a drain wiring 7b are formed on the third insulating film 6 to overlap with low resistance regions 3a and 3b, respectively, through contact holes. Further, a gate wiring 7c is formed on the third insulating film 6 to overlap with the gate electrode 5 through a contact hole.

The TFT having such a structure can be used as a resistance element of the semiconductor device. According to the TFT in the present Embodiment, just by applying a constant voltage, an effect of suppressing a variation in resistance can be more easily obtained. If a current which flows in the resistance element is decreased in view of operational circumstances of the circuit, a voltage of 0V is applied. Alternatively, if the TFT is an N-type TFT, a negative bias is applied, or if the TFT is a P-type TFT, a positive bias is applied, and thereby a current can be controlled.

As shown in FIG. 1(b), according to the configuration of the COLD structure TFT used in Embodiment 1, the first insulating film 2 composed of the impurity diffusion barrier film 2a and the stress relaxation layer 2b is formed on the substrate 1. A semiconductor layer 13 is formed on the first insulating film 2. The semiconductor layer 13 includes low resistance (high concentration impurity) regions 13a and 13b, a high resistance (low concentration impurity) region 13c, and a channel region 13d. The low resistance regions 13a and 13b function as source and drain, respectively. The second insulating film 4 that is a gate insulating film is formed on the semiconductor layer 13. A gate electrode 15 is formed on the second insulating film 4 to overlap with the channel region 13d and the high resistance region 13c. Further, the third insulating film 6 is formed over the gate electrode 15 and the second insulating film 4. A source wiring 17a and a drain wiring 17b are formed on the third insulating film 6 to overlap with the low resistance regions 13a and 13b, respectively, through contact holes. A gate wiring 17c is formed on the third insulating film 6 to overlap with the gate electrode 15 through a contact hole.

The TFT having such a structure can be used as a switching element in the semiconductor device. According to the TFT in the present Embodiment, a high-reliable TFT which shows excellent resistance to hot carrier deterioration even at a high voltage of 6V to 12V can be obtained.

The production method of the semiconductor device in Embodiment 1 in accordance with the present invention is mentioned with reference to FIGS. 2(a)-(f).

FIGS. 2(a) to 2(f) are cross-sectional views schematically showing production steps of the semiconductor device in Embodiment 1.

First, as shown in FIG. 2(a), the first insulating film 2 composed of the impurity diffusion barrier film 2a and the stress relaxation layer 2b is formed on the substrate 1. Then, the semiconductor layers 3 and 13 are formed in the resistance element TFT region 10 and the GOLD structure TFT region 20. In the present Embodiment, a glass substrate is used as the substrate 1, but not limited thereto. For example, a plastic substrate and the like can be used. Silicon nitride is used as a material for the impurity diffusion barrier film 2a constituting the first insulating film 2. Silicon oxide is used as a material for the stress relaxation layer 2b. However, the materials for the layers 2a and 2b are not especially limited thereto. Various insulating film materials such as silicon oxide, silicon nitride, tantalum oxide, and aluminum oxide can be used for the layers 2a and 2b. Each of the layers 2a and 2b may be a multilayer film including a plurality of layers made of such materials. The thickness of the impurity diffusion barrier film 2a is preferably within 50 to 300 nm. According to the present Embodiment, the thickness is 100 nm. The thickness of the stress relaxation layer 2b is preferably within 50 to 300 nm, similarly to the impurity diffusion barrier film 2a. According to the present Embodiment, the thickness is 100 nm. The impurity diffusion barrier film 2a and the stress relaxation layer 2b are formed by a plasma CVD (Chemical Vapor Deposition) method in the present Embodiment, but the formation method is not especially limited. A sputtering method, a normal pressure CVD method, a LPCVD (Low Pressure CVD) method, a remote plasma CVD method, and the like may be employed.

Polycrystalline silicon is used as a material for the semiconductor layers 3 and 13 in the present Embodiment, but the material is not especially limited. For example, amorphous silicon, microcrystalline silicon, polycrystalline silicon, germanium, and the like can be also used. The thickness of the semiconductor layers 3 and 13 is preferably within 10 to 200 nm. In the present Embodiment, the thickness is 50 nm. In the present Embodiment, the polycrystalline silicon which is used for forming the semiconductor layers 3 and 13 is formed by forming amorphous silicon by a plasma CVD method and then annealing the amorphous silicon by a laser annealing method. The method for forming the semiconductor layers 3 and 13 is not especially limited thereto, a solid phase crystallization method may be employed. The semiconductors 3 and 13 are formed into an island pattern by a photolithography method in the present Embodiment.

Then, as shown in FIG. 2(b), the second insulating film 4 is formed over the entire substrate 1. Impurities 21 are injected into the entire region of the resistance element TFT region 10 and the GOLD structure TFT region 20 to control a threshold (Vth). The second insulating film 4 preferably has a thickness of 10 to 100 nm. In the present Embodiment, the thickness is 50 nm. Further, in the present Embodiment, silicon oxide is used as a material for the second insulating film 4, but the material is not especially limited. Various insulating film materials such as silicon oxide, tantalum oxide, aluminum oxide, can be used. A multilayer film including a plurality of films made of these materials can be used. The second insulating film 4 is formed by a plasma CVD method in the present Embodiment, but the method is not especially limited. A sputtering method, a normal pressure CVD method, an LPCVD method, a remote plasma CVD method, and the like, can be formed. The impurity 21 is not especially limited. According to the present Embodiment, it is preferable that boron is injected with an energy of 30 to 60 keV and at a dose amount of 1E12 to 1E14 ion/cm$^2$ by an ion-doping method.

As shown in FIG. 2(c), a resist 23 is pattern-formed by a photolithography method in a region where a channel region of the GOLD structure TFT is to be formed. This resist 23 is used as a mask when impurities are injected. Then, phosphorus is injected as an impurity 22 into the resistance element TFT region 10 and the GOLD structure TFT region 20. The impurity 22 is not especially limited. According to the present Embodiment, it is preferable that the impurity 22 is doped at an energy of 30 to 60 keV by an ion-doping method at a dose amount of 1E13 to 1E14 ion/cm$^2$. As a result, a channel (low concentration impurity) region 3c is formed at the resistance element TFT region 10 of the semiconductor layer 3, and a channel region 13d and low concentration impurity regions 13c are formed at the GOLD structure TFT region 20 of the semiconductor layer 13. The channel region 13d is positioned between the low concentration impurity regions 13c.

As shown in FIG. 2(d), a metal film is formed in the resistance element TFT region 10 and the GOLD structure TFT region 20 by a sputtering method and then patterned into an island shape by a photolithography method. As a result, the gate electrodes 5 and 15 are formed. It is preferable that the thickness of the gate electrodes 5 and 15 is 200 to 500 nm. In the present Embodiment, a conductor having a multilayer structure composed of a tungsten (W) layer in 370 nm thickness as an upper layer and a tantalum nitride (TaN) layer as a lower layer in 50 nm thickness is used. With regard to the material for the gate electrode, a metal having a high melting point such as molybdenum (Mo), tantalum (Ta), tungsten (W), and titanium (Ti), and silicides of the above-mentioned materials, and the like, may be used. A stacked body consisting of some of the above-mentioned materials may be used.

As shown in FIG. 2(e), an impurity 24 is injected to form a high concentration impurity region in the resistance element TFT region 10 and the GOLD structure TFT region 20. The impurity 24 is not especially limited. According to the present Embodiment, it is preferable that the impurity 24 is doped with an energy of 30 to 80 keV and at a dose amount of 1E15 to 1E 16 ion/cm$^2$ by an ion doping method. At this time, the impurity 24 is not injected into the semiconductor layers 3 and 13 overlapping with the gate electrodes 5 and 15 in the resistance element TFT region 10 and the GOLD structure TFT region 20. As a result, the high concentration impurity regions 3a and 3b, and the low concentration impurity region 3c are formed in the semiconductor layer 3 of the resistance element TFT. The high concentration impurity regions 13a and 13b, the low concentration impurity region 13c, and the channel region 13d are formed in the semiconductor layer 13 of the GOLD structure TFT.

As shown in FIG. 2(f), the third insulating film 6 is formed over the entire substrate 1 to have any thickness. Then, the film 6 is subjected to thermal treatment, thereby activating the impurities. As a method of the thermal treatment, a furnace annealing method, a lamp annealing method, a laser annealing method, a self-activation method, and the like, can be used. In the present Embodiment, a lamp annealing method is used. According to the present Embodiment, a multilayer film composed of silicon oxide and silicon nitride is used as the material for the third insulating film 6. The material is not especially limited. Various insulating film materials such as silicon oxide, silicon nitride, tantalum oxide, and aluminum oxide can be used. A multilayer film including a plurality of films made of these materials can be used. In the present Embodiment, a plasma CVD method is adopted as a method of forming the third insulating film 6. However, the method is not especially limited. The third insulating film 6 may be formed by a sputtering method, a normal pressure CVD method, an LPCVD method, a remote plasma CVD method, and the like. Successively, the second insulating film 4 and the third insulating film 6 are etched to form contact holes on the high concentration impurity regions 3a, 3b, 13a, and 13b of the respective TFTs. Further, contact holes are formed on the gate electrodes 5 and 15. Then, source wirings 7a and 17a and drain wirings 7b and 17b are formed inside the contact holes and on the third insulating film 6. Gate wirings 7c and 17c are formed inside the contact holes on the gate electrodes 5 and 15 of the respective TFTs and on the third insulating film 6.

According to the production method of the semiconductor device in the present Embodiment, the channel (low concentration impurity) region 3c of the resistance element TFT region 10 and the low concentration impurity region 13c of the GOLD structure TFT region 20 can be formed at the same step. Thus, the production steps can be simplified.

An electronic device such as a liquid crystal display device and an organic electroluminescent display device, in which the semiconductor device in the present Embodiment is incorporated, can stably operate without being influenced by a temperature where the electronic device is used.

If thus-obtained resistance element TFT is an N-type TFT, a voltage of 6V to 12V is applied to the gate electrode, and thereby the variation in resistance can be more suppressed. If thus-obtained TFT resistance element is a P-type TFT, a voltage of −6V to −12V is applied to the gate electrode, and thereby the variation in resistance can be more suppressed.

"Evaluation Test 1"

FIG. 3 is a chart showing a correlation among a voltage between gate and source (Vgs), a voltage between drain and source (Vds), a resistance between drain and source. As shown in FIG. 3, when the voltage between gate and source (Vgs) was 8V or 12V, the resistance between drain and source Rnm (kΩ/□) was not so varied in accordance with the variation in the voltage between drain and source (Vds). In contrast, when a voltage between gate and source (Vgs) was 0V or 4V, the resistance between drain and source Rnm (kΩ/□) was largely varied in accordance with the valuation in the voltage between drain and source (Vds). The impurity concentration in the low concentration impurity region in this case is 1E17 to 1E18 ion/cm$^3$.

"Evaluation Test 2"

FIG. 4 is a chart showing a variation in resistance of the resistance element TFT prepared in Embodiment 1, in accordance with a difference in impurity concentration. In Evaluation Test 2, two different resistance elements were prepared. One had a resistance of 60 kΩ/□. The other had a resistance of 30 kΩ/□. The gate was in a floating state when these resistances were measured. The test results obtained using these resistance elements show that when a gate voltage Vg was 8V or 12V, a difference in drain-source resistance Rnm (kΩ/□) between the resistance element having a resistance of 60 kΩ/□ and the resistance element having a resistance of 30 kΩ/□ was small.

FIG. 5 is a chart showing a correlation between a gate voltage and a variation in resistance, based on the results shown in FIG. 4. As shown in FIG. 5, when a gate voltage (Vg) was 6V or more, a variation in ratio of R1 to R2 was hardly observed. In contrast, when a gate voltage was less than 6V, the ratio was largely varied. The voltage (Vds) between source and drain of the resistance element in this case was 0.3V. That is, according to the semiconductor device in Embodiment 1, the variation in resistance can be suppressed even if the semiconductor device includes the resistance element having different impurity concentrations.

"Evaluation Test 3"

Each of FIGS. 6-a, 6-b, and 6-c is a chart showing temperature dependency of a resistance of the resistance element TFT prepared in Embodiment 1. A resistance between drain and source and a voltage (Vds) between drain and source at each temperature (20° C., 60° C., 100° C., and 140° C.) were measured when a voltage (Vgs) between gate and source was 4V, 8V, or 12V. Thus, a variation in resistance is shown. FIG. 6-a shows the results when a gate voltage was 4V. FIG. 6-b shows the results obtained when a gate voltage was 8V. FIG. 6-c shows the results obtained when a gate voltage was 12V. As a result, when a voltage between gate and source (Vgs) was 8V or 12V, the resistance Rnm (kΩ/□) was not largely varied in accordance with the variation in temperature. Such a result shows that the resistance Rnm (kΩ/□) hardly depends on a temperature when the voltage (Vgs) between gate and source is 8V or 12V. The impurity concentration of the resistance element used in this case was 1E17 to 1E18 ion/cm$^3$.

"Evaluation Test 4"

Each of FIGS. 7-a and 7-b is a chart showing a correlation between a gate-source voltage (Vgs) and a drain-source current (Ids) when a drain-source voltage (Vds) is fixed. FIG. 7-a shows a state when the drain-source voltage (Vds) is 0.1 V. FIG. 7-b shows a state when the drain-source voltage (Vds) is 5V.

As shown in FIG. 7-a, when the voltage between gate and source (Vgs) is 0.1V, neither the current nor the resistance shows temperature dependency when the voltage between gate and source (Vgs) is about 8V. As shown in FIG. 7-b, when a voltage between drain and source (Vds) is 5V, neither the current nor the resistance shows temperature dependency when the voltage between gate and source (Vgs) is about 10V. Accordingly, when a voltage between gate and source (Vgs) is within 8 to 10V, the current and the resistance less shows temperature dependency when the voltage between gate and source (Vds) is 0.1 to 5V within the range of 8 to 10V. Therefore, this region is an optimal voltage range. Further, within ±2V of this optimal region, that is, a region where the voltage between gate and source (Vgs) is 6V to 12V, the variation in resistance is small. Therefore, this region of 6V to 12V is an excellent condition.

The present application claims priority under the Paris Convention and the domestic law in the country to be entered into national phase on Patent Application No. 2006-244516 filed in Japan on Sep. 8, 2006, the entire contents of which are hereby incorporated by reference.

The terms "or more" and "or less" in the present description means that the value described (boundary value) is included.

Brief Description of Drawings

FIGS. 1(*a*) and 1(*b*) is a cross-sectional view schematically showing each TFT in the semiconductor device in Embodiment 1. FIG. 1(*a*) shows a resistance element TFT. FIG. 1(*b*) shows a GOLD structure TFT.

FIG. 2(*a*)-(*f*) is a schematic view showing the production method of the semiconductor device in Embodiment 1.

FIG. 3 is a chart showing a correlation among a voltage between gate and source (Vgs), a voltage between drain and source (Vds), a variation in resistance.

FIG. 4 is a chart showing a variation in resistance of the resistance element TFT prepared in Embodiment 1, in accordance with a difference in impurity concentration.

FIG. 5 is a chart showing a correlation between a gate voltage (Vg) and a variation in resistance, based on the results shown in FIG. 4.

[FIG. 6-a]

FIG. 6-a is a chart showing temperature dependency of a resistance of the resistance element TFT prepared in Embodiment 1, when a voltage between gate and source (Vgs) is 4V.

[FIG. 6-b]

FIG. 6-b is a chart showing temperature dependency of a resistance of the resistance element TFT prepared in Embodiment 1, when a voltage between gate and source (Vgs) is 8V.

[FIG. 6-c]

FIG. 6-c is a chart showing temperature dependency of a resistance of the resistance element TFT prepared in Embodiment 1, when a voltage between gate and source (Vgs) is 12V.

[FIG. 7-a]

FIG. 7-a is a chart showing a correlation among a voltage between gate and source (Vgs) and a current between drain and source (Ids) when a voltage between drain and source (Vds) is 0.1V.

[FIG. 7-b]

FIG. 7-b is a chart showing a correlation among a voltage between gate and source (Vgs) and a current between drain and source (Ids) when a voltage between drain and source (Vds) is 5V.

Explanation of Numerals and Symbols

Figure 1:
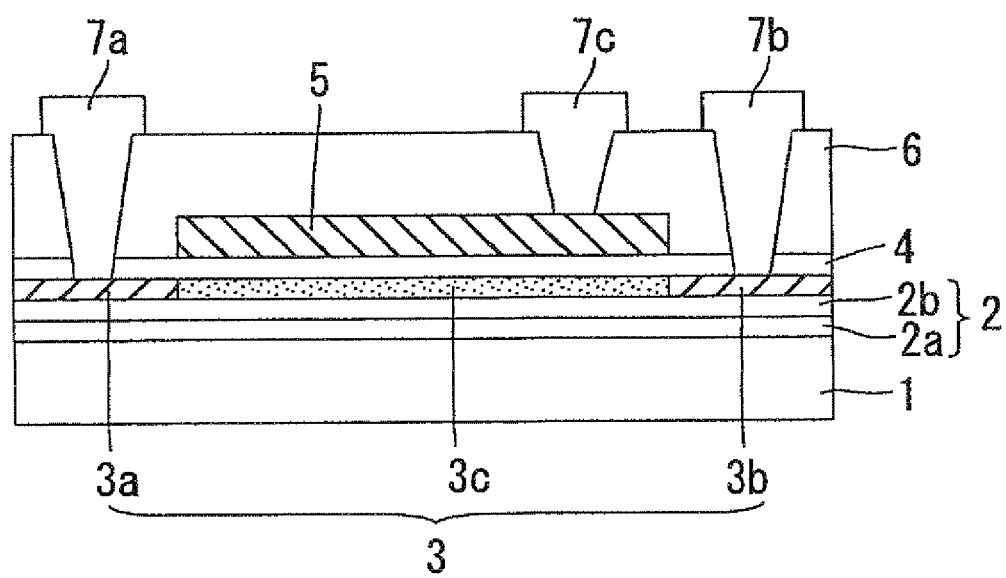
[FIGS. 1(*a*) and 1(*b*)]
Figure 1:
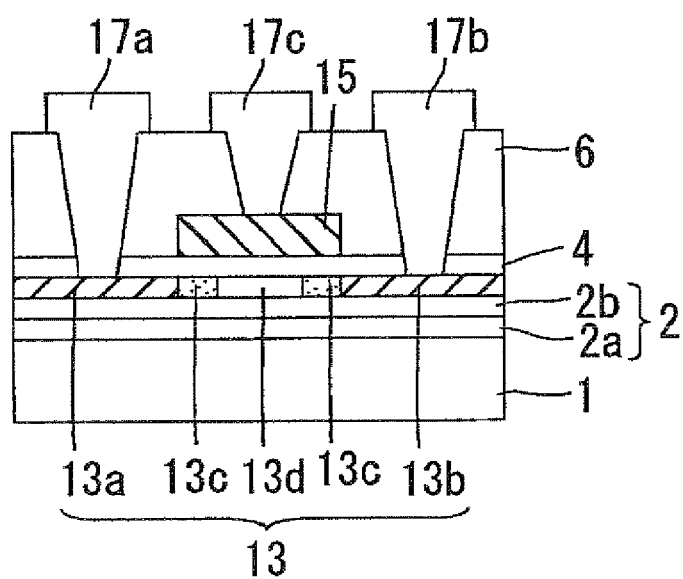
Figure 2:
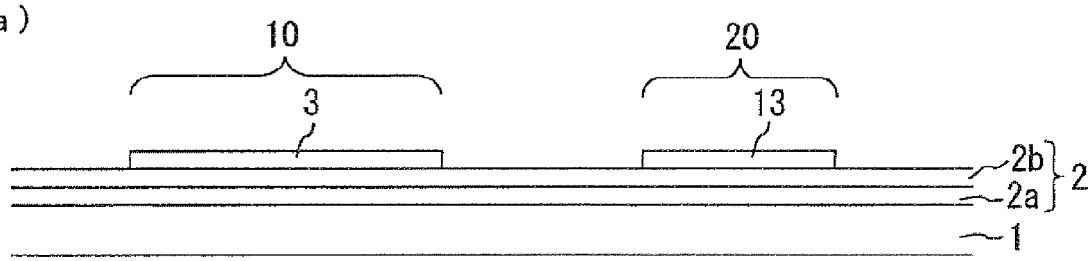
[FIGS. 2(*a*)-(*f*)]
Figure 2:
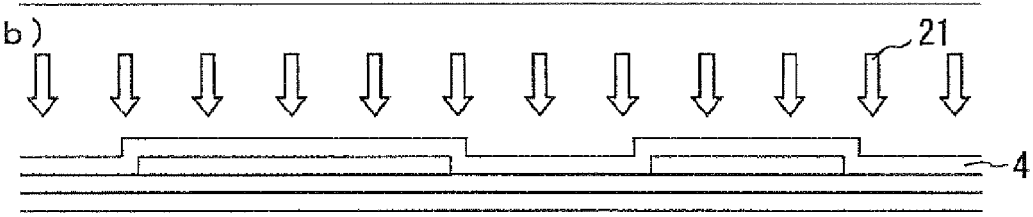
Figure 2:
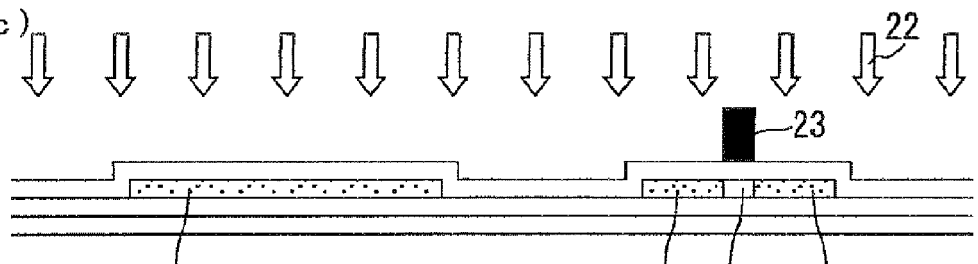
Figure 2:
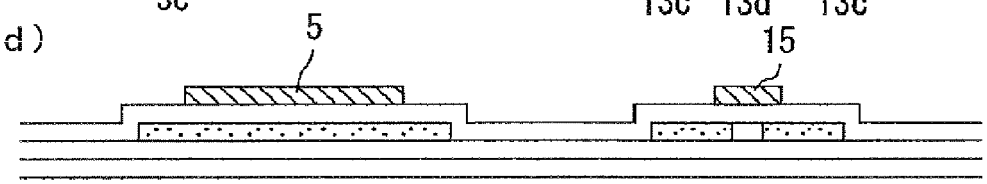
Figure 2:
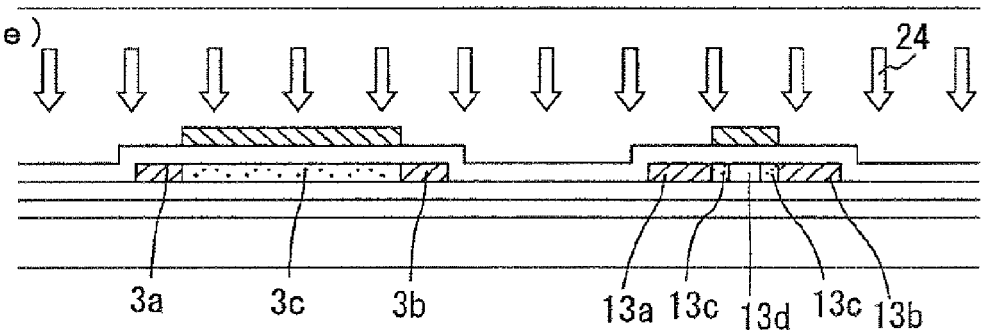
Figure 2:
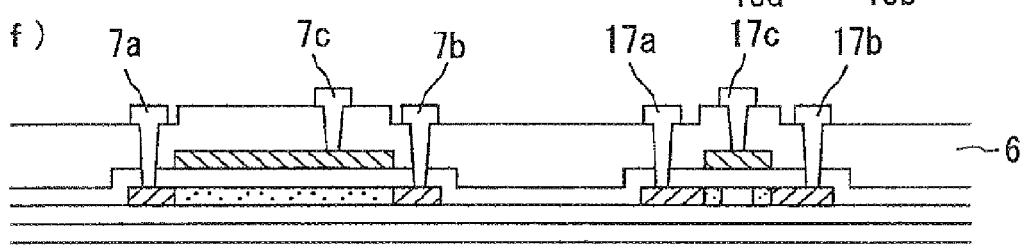
Figure 3:
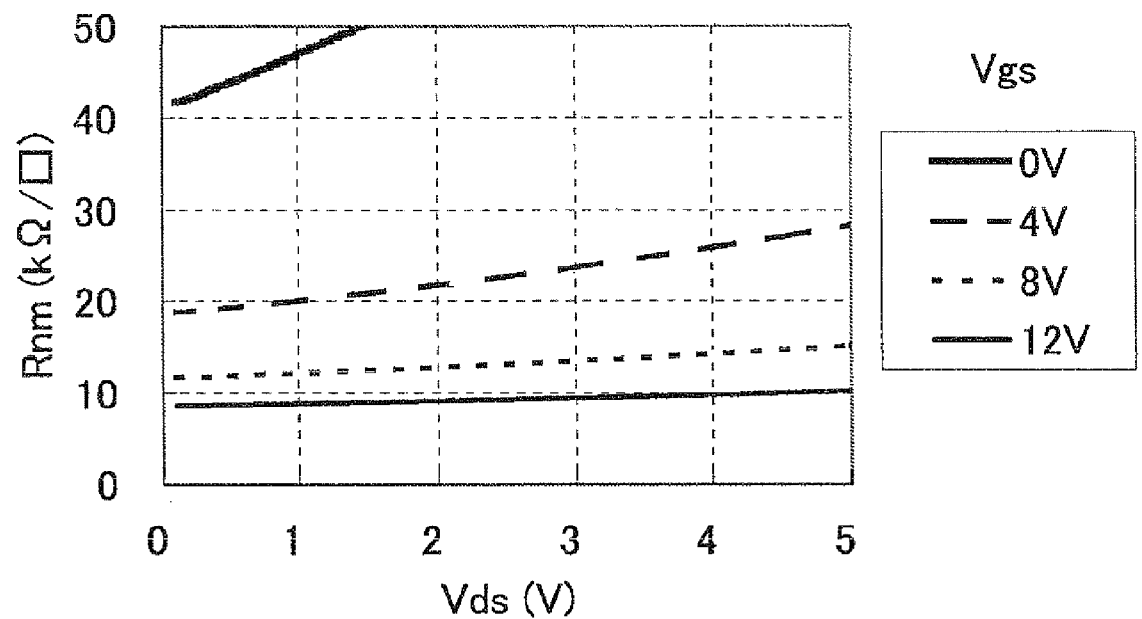
[FIG. 3]
Figure 4:
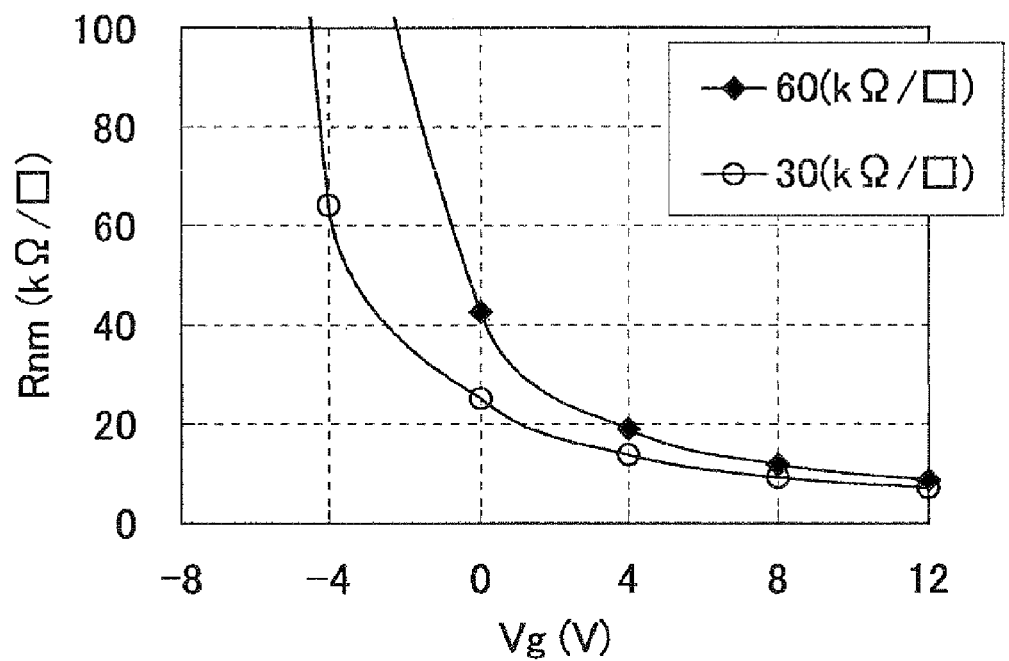
[FIG. 4]
Figure 5:
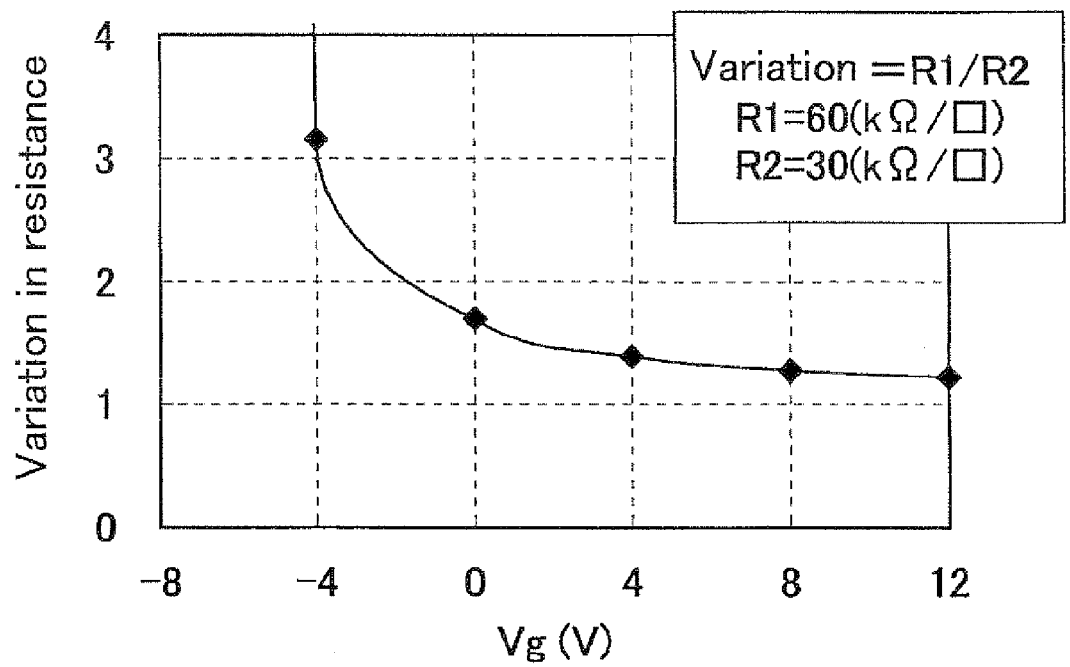
[FIG. 5]
Figure 5:
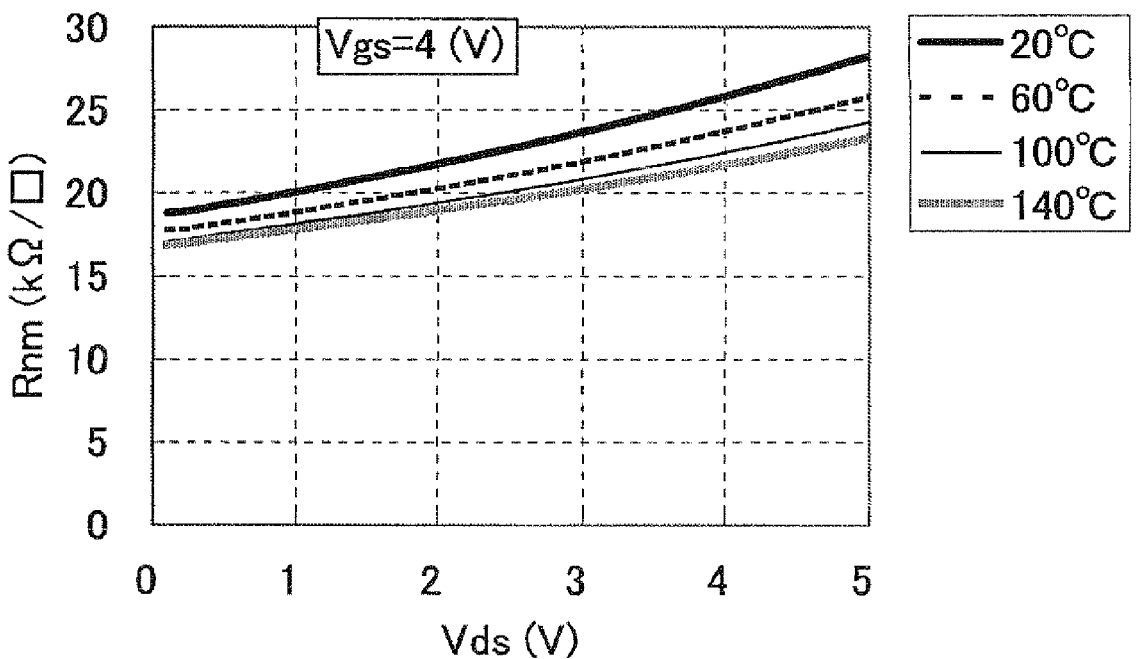

1: Substrate
2: The first insulating layer
2a: Impurity diffusion barrier film
2b: Stress relaxation layer
3, 13: Semiconductor layer
3a, 13a: High concentration impurity region (low resistance region)
3b, 13b: High concentration impurity region (low resistance region)
3c, 13c: Low concentration impurity region (high resistance region, channel region)
13d: Channel region (low concentration impurity region)
4: The second insulating film
5, 15: Gate electrode
6: Third insulating layer
7a, 17a: Source wiring
7b, 17b: Drain wiring
7c, 17c: Gate wire
10: Resistance element TFT region
20: GOLD structure TFT region
21, 22, 24: Impurity
23: Resist

The invention claimed is:

1. A semiconductor device, comprising:
a first thin film transistor and a second thin film transistor on a substrate,
wherein the first thin film transistor is used as a resistance element and includes a first semiconductor layer having a channel region,
wherein the second thin film transistor includes a second semiconductor layer having a low concentration drain region and a high concentration drain region, the low concentration drain region and the high concentration drain region being different in impurity concentration, and
wherein an impurity concentration of the channel region of the first semiconductor layer in the first thin film transistor is the same as an impurity concentration of the low concentration drain region of the second semiconductor layer in the second thin film transistor.

2. The semiconductor device according to claim 1, wherein a resistance in the channel region of the first semiconductor layer in the first thin film transistor varies depending on a voltage applied to a gate electrode.

3. The semiconductor device according to claim 2, wherein the first thin film transistor is an N-type transistor.

4. The semiconductor device according to claim 2, wherein the first thin film transistor is a P-type transistor.

5. An electronic device comprising the semiconductor device of claim 1.

6. The semiconductor device according to claim 1, wherein a net impurity concentration of the channel region of the first semiconductor layer in the first thin film transistor is one of N- or P-type and a net impurity concentration of the low concentration drain region of the second semiconductor layer in the second thin film transistor is the same type.

7. The semiconductor device according to claim 1, wherein a gate electrode of the second thin film transistor completely overlaps the low concentration drain region of the second semiconductor layer of the second thin film transistor.

8. The semiconductor device according to claim 1, wherein a gate electrode of the first thin film transistor is aligned so as to substantially completely overlap the channel region of the first semiconductor layer of the first thin film transistor.

9. The semiconductor device according to claim 1,
wherein the first semiconductor layer further includes high impurity concentration source and drain regions on both sides of the channel region of the first semiconductor layer,
wherein the first thin film transistor further comprises source and drain wirings connected respectively to the source and drain regions of the first semiconductor layer,
wherein the second semiconductor layer further includes a high impurity concentration source region and a low impurity concentration source region,
wherein the second thin film transistor further comprises source and drain wirings connected respectively to the high impurity concentration source and drain regions of the second semiconductor layer,
wherein the source and drain wirings of the first semiconductor layer are separate from the source and drain wirings of the second semiconductor layer.

10. The semiconductor device according to claim 1, wherein an impurity concentration of the channel region of the first thin film transistor and an impurity concentrations of the low concentration drain region of the second thin film transistor both range substantially between $10^{17}$ and $10^{18}$ ion/cm$^3$.

* * * * *